United States Patent
Nam et al.

(10) Patent No.: US 8,249,851 B2
(45) Date of Patent: Aug. 21, 2012

(54) MONITORING SYSTEM USING REAL-TIME SIMULATOR

(75) Inventors: Su Chul Nam, Daejeon (KR); Jae Gul Lee, Daejeon (KR); Seung Tae Cha, Daejeon (KR); Jeong Hoon Shin, Daejeon (KR); Tae Kyun Kim, Daejeon (KR)

(73) Assignee: Korea Electric Power Corporation, Gangnam-Gu (KR)

( * ) Notice: Subject to any disclaimer, the term of this patent is extended or adjusted under 35 U.S.C. 154(b) by 814 days.

(21) Appl. No.: 12/351,525

(22) Filed: Jan. 9, 2009

(65) Prior Publication Data

US 2010/0179800 A1 Jul. 15, 2010

(51) Int. Cl.
*G06F 17/50* (2006.01)

(52) U.S. Cl. .......................................... 703/18

(58) Field of Classification Search ...................... 703/18
See application file for complete search history.

(56) References Cited

U.S. PATENT DOCUMENTS

| | | | | |
|---|---|---|---|---|
| 5,963,734 A * | 10/1999 | Ackerman et al. | | 703/18 |
| 2003/0040897 A1* | 2/2003 | Murphy et al. | | 703/18 |
| 2004/0153303 A1* | 8/2004 | Tang et al. | | 703/18 |
| 2004/0158360 A1* | 8/2004 | Garland, II et al. | | 700/286 |
| 2007/0282588 A1* | 12/2007 | Smith | | 703/18 |
| 2008/0103737 A1* | 5/2008 | Yoon et al. | | 703/4 |

* cited by examiner

*Primary Examiner* — Dwin M Craig
(74) *Attorney, Agent, or Firm* — McDermott Will & Emery LLP

(57) ABSTRACT

A monitoring system using a real-time simulator, providing a simulation environment of a real electric power system that enables testing of a new electric power system control facility. The operation of the new electric power system control facility and effects thereof on a real electric power system can be evaluated before actual installation. The monitoring system includes a test piece installed in an electric power system; a simulator connected to the test piece, and deriving electric power system simulation data by simulating the electric power system with respect to the test piece; a multimedia interface (MMI) platform interworking with the simulator, providing the simulator with electric power system status data for simulating the electric power system, and receiving the electric power system simulation data from the simulator; and an MMI client interworking with the MMI platform to display the electric power system simulation data from the MMI platform.

7 Claims, 6 Drawing Sheets

MONITORING SYSTEM USING REAL-TIME SIMULATOR

BACKGROUND OF THE INVENTION

1. Field of the Invention

The present invention relates to a monitoring system using a real-time simulator that enables evaluation of operations and effects of a new electric power system control facility in a simulated environment of a real electric power system.

2. Description of the Related Art

Electric energy, which is indispensable in modern industries, is generated and transferred through electric power systems. Electric energy generated by various types of generating plants is transmitted through high-voltage power transmission facilities and substations to power distribution facilities, which then distribute the electric energy though distribution lines to individual customers, who then consume the electric energy to operate various electrical appliances.

As the society becomes more dependent on electricity, the size of electric power systems tends to increase, which makes it more difficult to operate the electric power systems. To secure stability of electric power systems, it is necessary to develop and install new electric power system control equipment.

However, unlike systems in the past, current electric power systems involve complex facilities, and it is not easy to actually install newly developed electric power system control facilities. Hence, to facilitate installation of a newly developed electric power system control facility in an existing electric power system, it is necessary to provide a verification environment that enables evaluation of the impact of the new electric power system control facility on the existing electric power system before actual installation.

BRIEF SUMMARY OF THE INVENTION

The present invention has been made in view of the above problems, and the present invention provides a monitoring system using a real-time simulator that enables evaluation of operations and effects of a new electric power system control facility in a simulated environment of a real electric power system.

In accordance with an embodiment of the present invention, there is provided a monitoring system using real-time simulator, including: a test piece to be installed in an electric power system; a simulator connected to the test piece, and deriving electric power system simulation data related to the test piece by simulating the electric power system with respect to the test piece; a multimedia interface (MMI) platform interworking with the simulator, providing the simulator with electric power system status data for simulating the electric power system with respect to the test piece, and receiving the electric power system simulation data related to the test piece from the simulator; and an MMI client interworking with the MMI platform to display the electric power system simulation data related to the test piece from the MMI platform.

The electric power system simulation data related to the test piece may include information regarding voltages, currents, bus voltages, line power flows and breaker statuses of the simulated electric power system.

The electric power system status data may include information regarding voltage changes, frequency changes, component changes, and contingencies in the electric power system.

The simulator may communicate with the MMI platform through an Ethernet connection.

The MMI platform may include: a data collector storing the electric power system status data to be provided to the simulator, and the electric power system simulation data related to the test piece coming from the simulator; an MMI server interworking with the simulator and data collector, and controlling transmission of the electric power system status data to the simulator and reception of the electric power system simulation data from the simulator; and an algorithm server interworking with the MMI server, computing the active and reactive power flowing in each line and the voltage and phase angle at each bus on the basis of the electric power system simulation data related to the test piece from the simulator, and visualizing the computed values.

The MMI client may communicate with the MMI platform through Transmission Control Protocol/Internet Protocol (TCP/IP).

The MMI client may include: a first display having a plurality of personal computers, and displaying the electric power system simulation data related to the test piece on the personal computers in connection with the MMI server of the MMI platform; and a second display having a large panel, and displaying the electric power system simulation data related to the test piece on the large panel in connection with the MMI server of the MMI platform.

The electric power system simulation data related to the test piece may be displayed on one of a screen using a one-line diagram, a GIS-based 3D screen, and a run-time screen.

In a feature of the present invention, a new electric power system control facility can be tested through simulation using a real-time simulator. Hence, the system operator can identify and evaluate the operation of the new electric power system control facility and effects thereof on the existing electric power system before actual installation. As a result, the reliability of the new electric power system control facility with respect to the existing electric power system can be enhanced.

In addition, the monitoring system provides an MMI platform that stores and manages effective and instantaneous values obtained through simulation of a new electric power system control facility using a real-time simulator. Hence, the system operator can effectively utilize the simulation results.

Further, the monitoring system provides monitoring screens to visualize simulation results of a new electric power system control facility using one-line diagrams and GIS-based 3D maps. Hence, the system operator can intuitively identify the operation and effects of the new electric power system control facility, and cope with probable problems in advance.

Finally, the monitoring system provides an MMI client that implements a realistic feeder station environment. Hence, through simulation, the system operator can learn strategies for controlling and operating the electric power system in the case of various contingencies.

BRIEF DESCRIPTION OF THE DRAWINGS

The features and advantages of the present invention will be more apparent from the following detailed description in conjunction with the accompanying drawings, in which.

DETAILED DESCRIPTION OF THE INVENTION

Hereinafter, embodiments of the present invention are described in detail with reference to the accompanying drawings. The same reference symbols are used throughout the drawings to refer to the same or like parts. Detailed descriptions of well-known functions and structures incorporated herein may be omitted to avoid obscuring the subject matter of the present invention.

Figure 1:
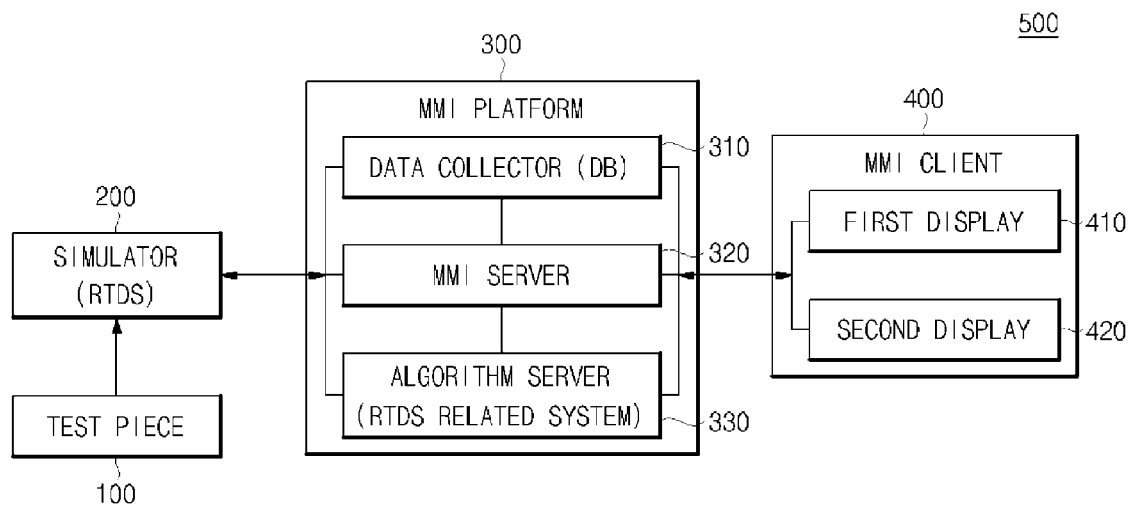
FIG. 1 is a block diagram of a monitoring system using a real-time simulator according to an embodiment of the present invention.
Figure 2:
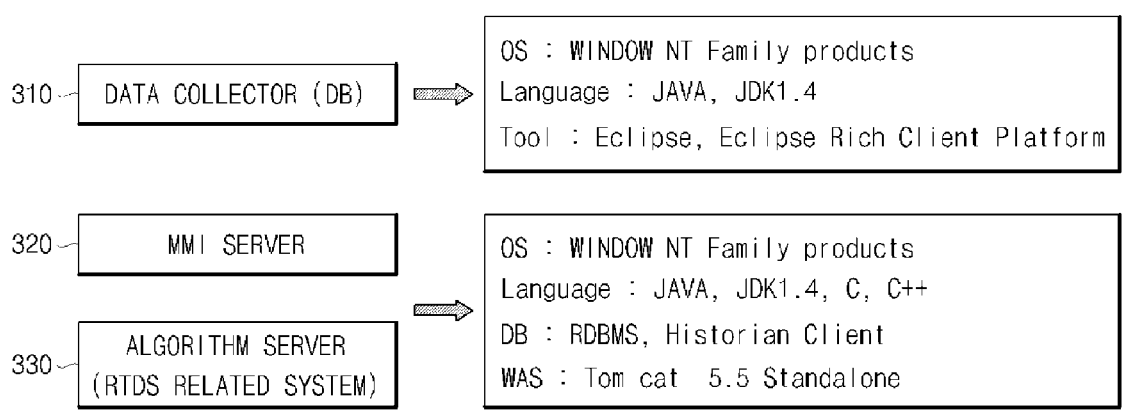
FIG. 2 illustrates a software configuration of an MMI platform in the system of FIG. 1.
Figure 3:
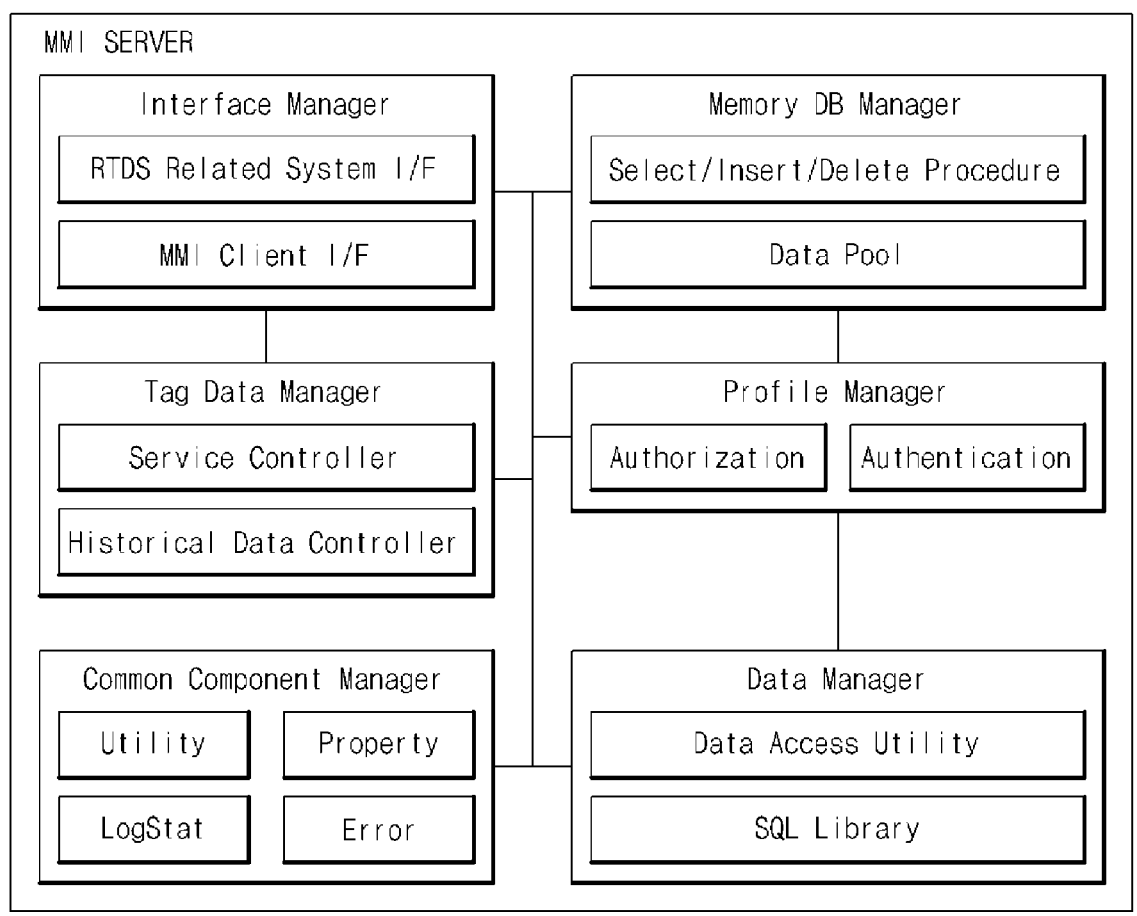
FIG. 3 illustrates a configuration of an MMI server in the system of FIG. 1.
Figure 4:
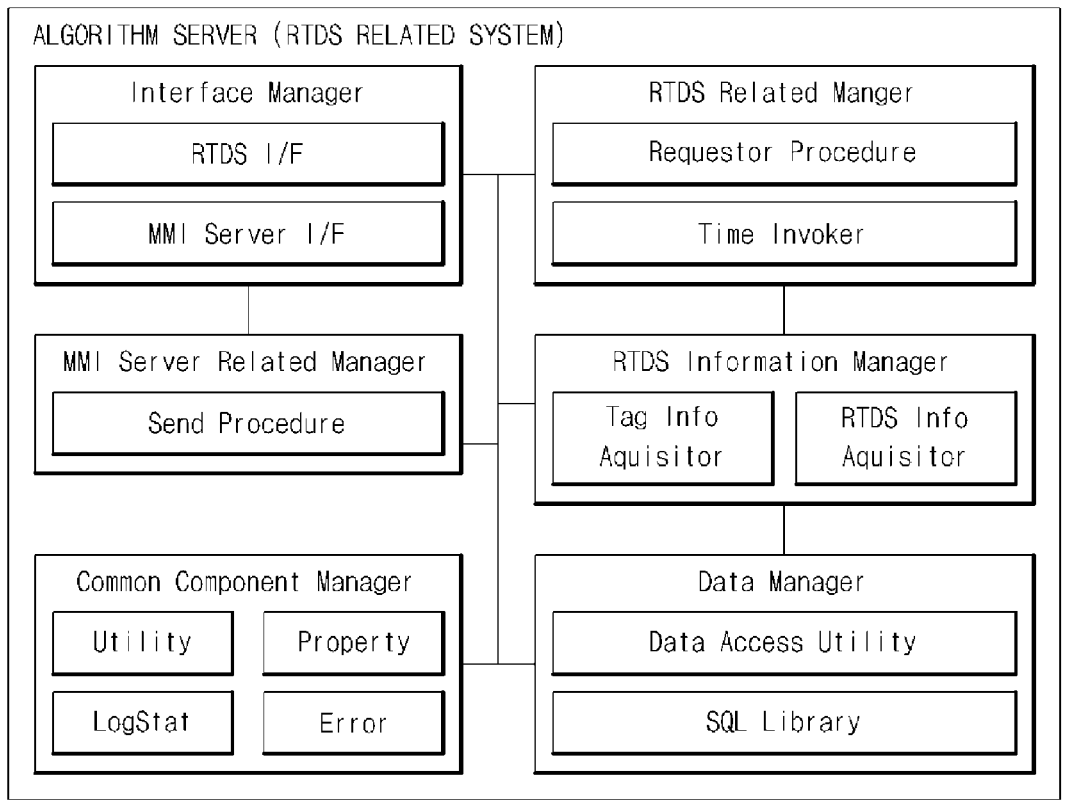
FIG. 4 illustrates a configuration of an algorithm server in the system of FIG. 1.
Figure 5:
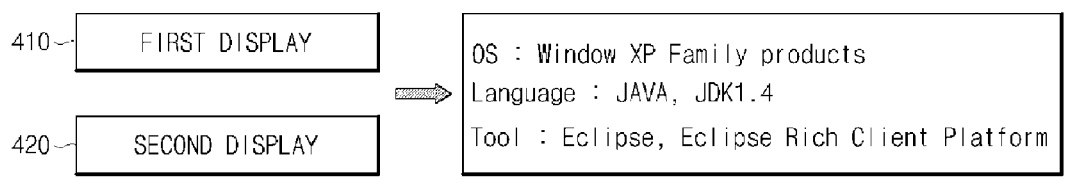
FIG. 5 illustrates a software configuration of an MMI client in the system of FIG. 1.
Figure 6:
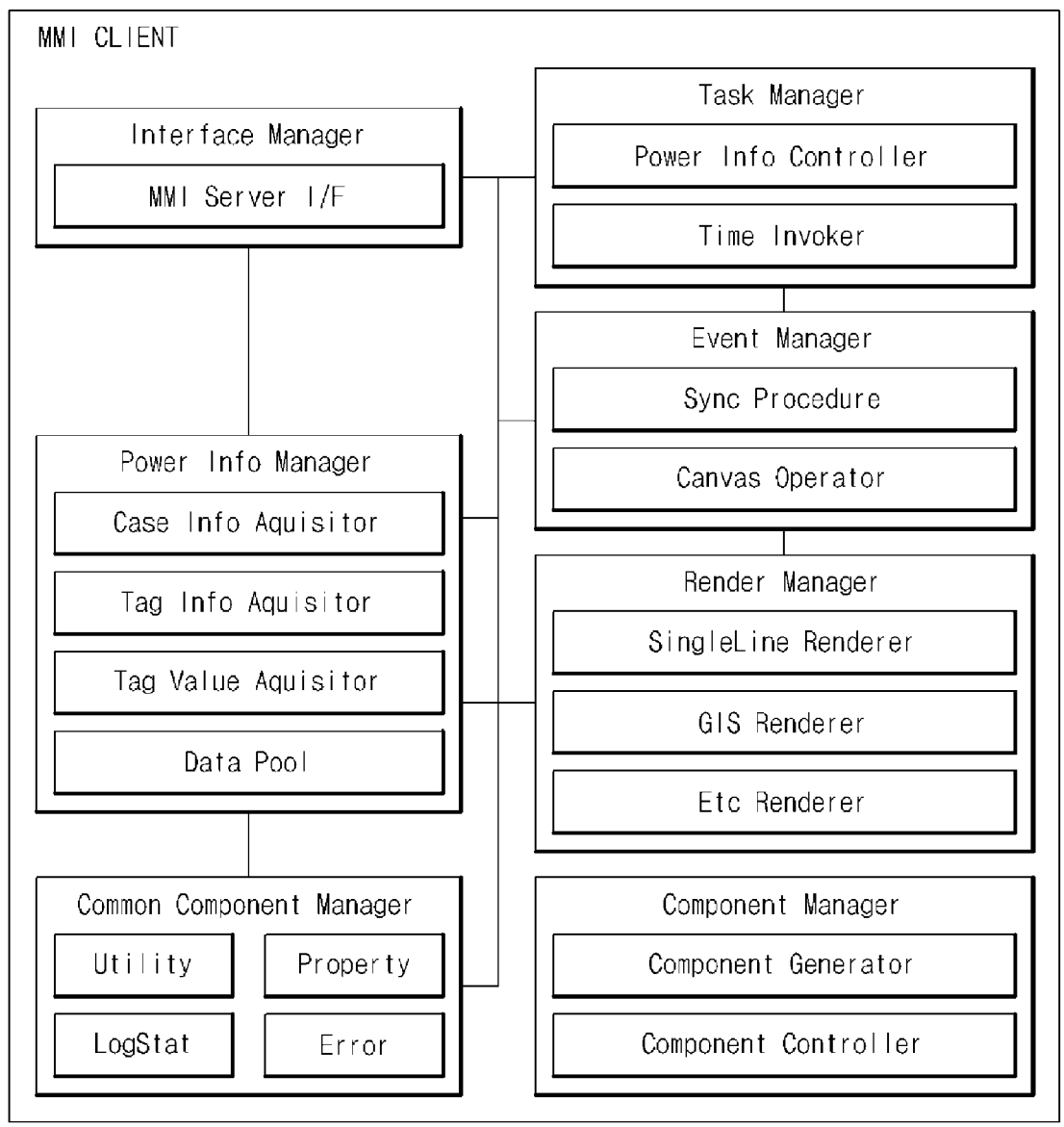
FIG. 6 illustrates a configuration of the MMI client in the system of FIG. 1.
Figure 7:
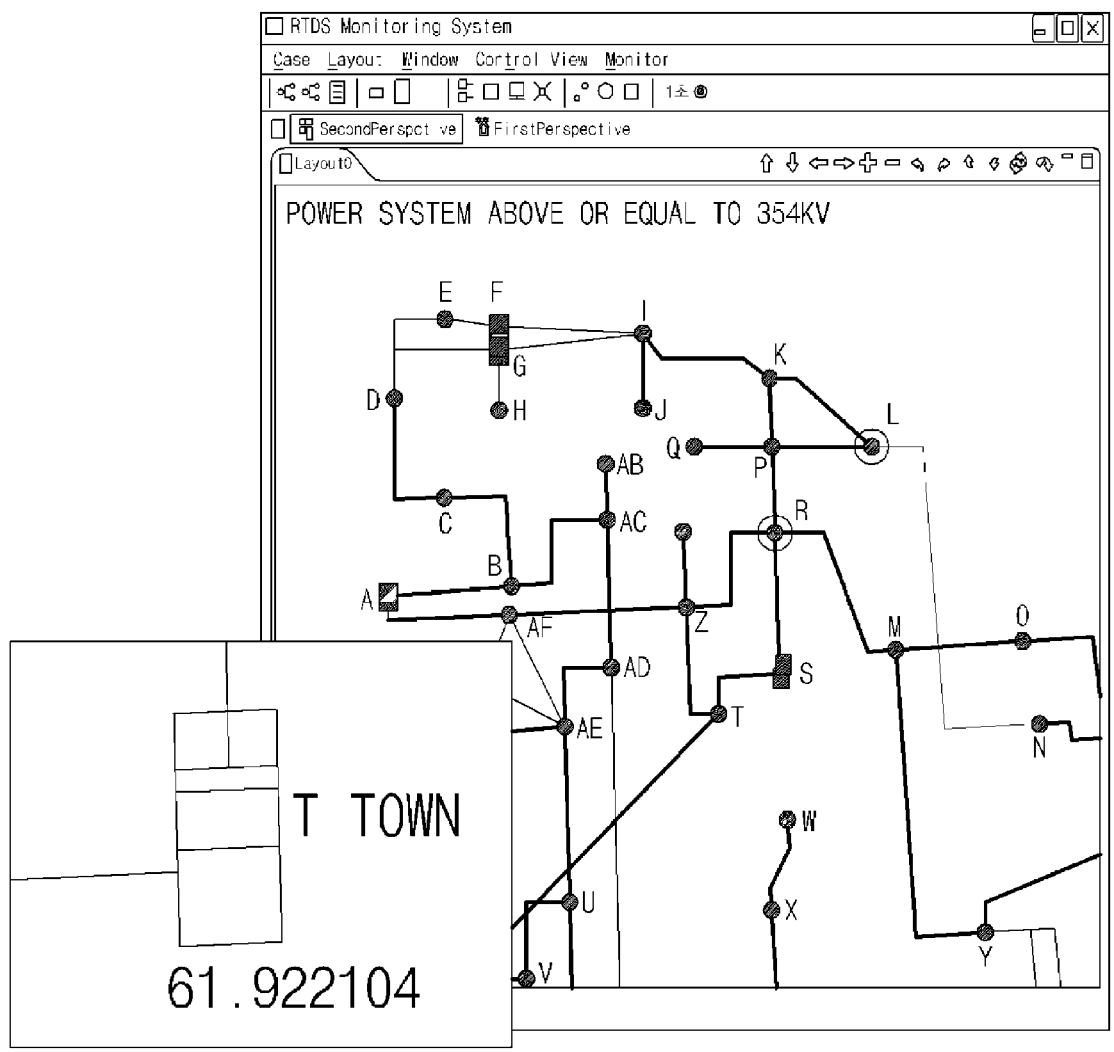
FIG. 7 is a monitoring screen displaying a one-line diagram produced by the MMI client in the system of FIG. 1.
Figure 8:
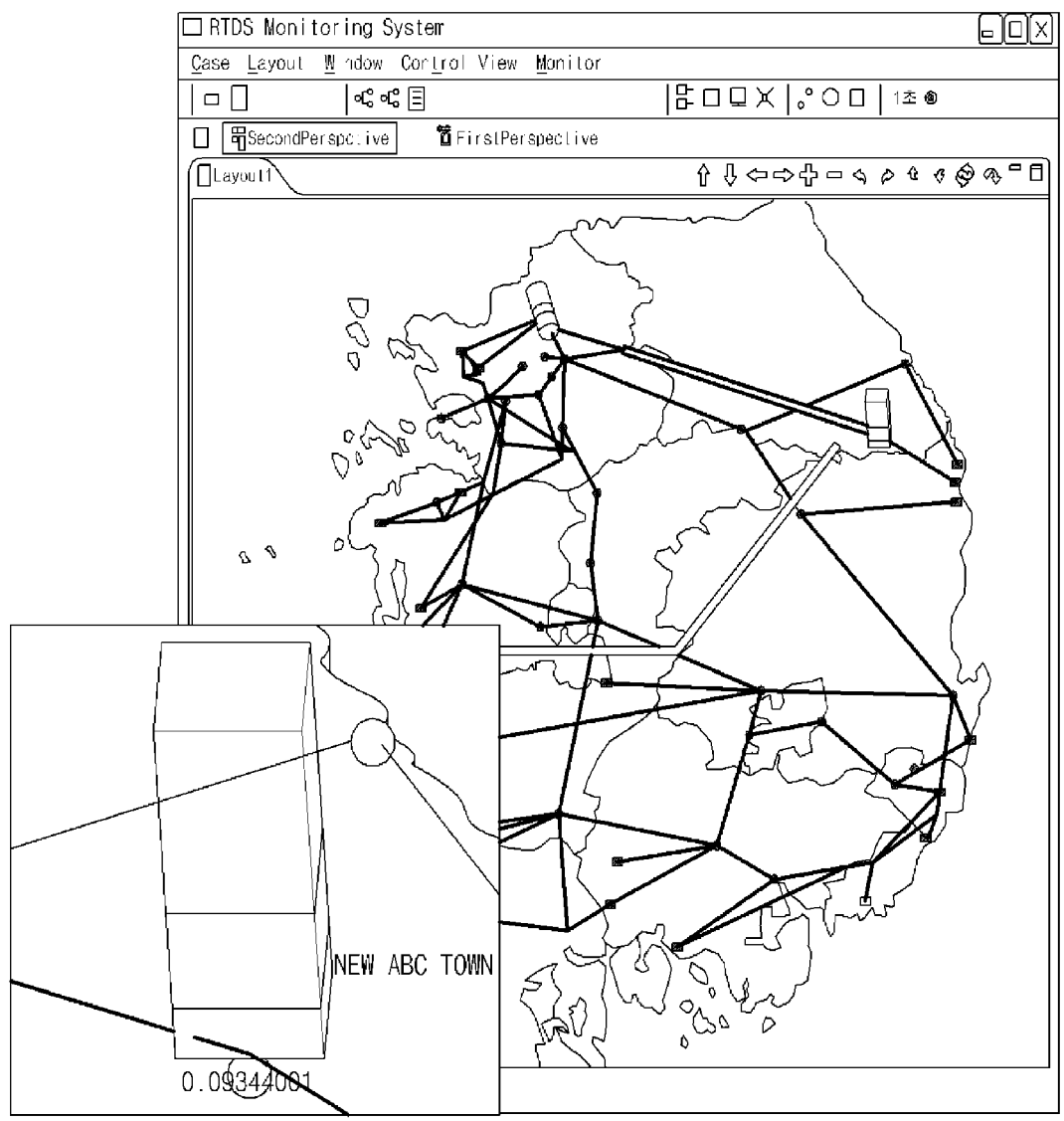
FIG. 8 is a monitoring screen displaying a GIS-based 3D map produced by the MMI client in the system of FIG. 1.

FIG. 1 is a block diagram of a monitoring system using a real-time simulator according to an embodiment of the present invention; FIG. 2 illustrates a software configuration of an MMI platform in the system; FIG. 3 illustrates a configuration of an MMI server; FIG. 4 illustrates a configuration of an algorithm server; FIG. 5 illustrates a software configuration of an MMI client; FIG. 6 illustrates a configuration of the MMI client; FIG. 7 is a monitoring screen displaying a one-line diagram produced by the MMI client; and FIG. 8 is a monitoring screen displaying a GIS-based 3D map produced by the MMI client.

Referring to FIG. 1, the monitoring system 500 of the present embodiment includes a test piece 100, simulator 200, multimedia interface (MMI) platform 300, and MMI client 400.

The test piece 100 is an object to be tested, and corresponds to a piece of equipment of an electric power system such as a protective relay. The test piece 100 may typically be a newly developed electric power system control facility scheduled for installation in the electric power system.

The simulator 200 is a real-time digital simulator (RTDS), and simulates an electric power system in which the test piece 100 is to be installed. That is, the simulator 200 is connected to the test piece 100, and tests the test piece 100 in real time in a simulated electric power system to evaluate operational characteristics of the test piece 100. Through simulation, the simulator 200 derives electric power system simulation data such as electric power system voltages, currents, bus voltages, line power flows and breaker statuses with respect to the test piece 100. The simulator 200 is configured in units of racks, and each rack includes a workstation interface (WIF) card.

The MMI platform 300 interworks with the simulator 200, and provides the simulator 200 with real electric power system status data, related to voltage changes, frequency changes, component changes and contingencies, necessary for simulation of the test piece 100. The MMI platform 300 receives and stores electric power system simulation data obtained by the simulator 200 with respect to the test piece 100.

To be more specific, the MMI platform 300 includes a data collector 310 (database), MMI server 320, and algorithm server 330 (RTDS related system). The MMI platform 300 communicates with the simulator 200 through an Ethernet connection, and can have a software configuration illustrated in FIG. 2. That is, the data collector 310 employs WINDOWS NT families as an operating system, Java and JDK 1.4 as languages, and Eclipse and Rich Client Platform as tools. The MMI server 320 and algorithm server 330 employ WINDOWS NT families as an operating system, JAVA, JDK 1.4, C and C++ as languages, RDBMS and Historian Client as databases, and Tomcat 5.5 Standalone as a Web application server.

The data collector 310 stores real electric power system status data to be provided to the simulator 200, and the electric power system simulation data received from the simulator 200 in relation to the test piece 100.

The MMI server 320 interworks with the simulator 200 and data collector 310, and communicates through Ethernet with the WIF card of the simulator 200. The MMI server 320 controls transmission of real electric power system status data to the simulator 200, and reception of the electric power system simulation data from the simulator 200 in relation to the test piece 100. The communication protocol between the MMI server 320 and simulator 200 may be SimProtocol being a proprietary protocol for simulation. The MMI server 320 can have a configuration illustrated in FIG. 3. That is, the MMI server 320 includes an interface manager for interface management, a tag data manager for managing tag data, a common component manager for managing common components, a memory DB manager for managing a memory database, a profile manager for managing authorization and authentication, and a data manager for data management. To be more specific, the interface manager includes a RTDS related system interface and MMI client interface; the tag data manager includes a service controller and historical data controller; the common component manager includes Utility, Property, and Logstat, and Error; the memory DB manager includes select/insert/delete procedures and a data pool; the profile manager includes Authorization and Authentication; and the data manager includes a data access utility and SQL library.

The algorithm server 330 interworks with the MMI server 320, computes the active and reactive power flowing in each line and the voltage and phase angle at each bus on the basis of the electric power system simulation data from the simulator 200 obtained through simulation in relation to the test piece 100, and visualizes the computed values using a visualization program. The algorithm server 330 sends the computed values for the active and reactive power flowing in each line and the voltage and phase angle at each bus via the MMI server 320 to the data collector 310 for storage. The algorithm server 330 can have a configuration illustrated in FIG. 4. That is, the algorithm server 330 includes an interface manager for interface management, a MMI server related manager for managing interworking with the MMI server 320, a common component manager for managing common components, an RTDS related manager for managing interworking with the simulator 200, an RTDS information manager for managing information from the simulator 200, and data manager for data management. To be more specific, the interface manager includes an RTDS interface and MMI server interface; the MMI server related manager includes a Send procedure; the common component manager includes Utility, Property, Logstat and Error; the RTDS related manager includes a requestor procedure and time invoker; the RTDS information manager includes a tag information aquisitor and RTDS information aquisitor; and the data manager includes a data access utility and SQL library.

The MMI client 400 interworks with the MMI platform 300 (more specifically MMI server 320) to display the electric power system simulation data from the MMI platform 300 obtained through simulation in relation to the test piece 100. The MMI client 400 notifies the system operator of the behavior of the test piece 100 and impacts thereof on a real electric power system in an intuitive manner in real time. The MMI client 400 communicates with the MMI server 320 of the MMI platform 300 through Transmission Control Protocol/Internet Protocol (TCP/IP).

The MMI client 400 includes a first display 410 and second display 420. The first display 410 is relatively small, and can be supported by a personal computer with about four monitoring screens. The second display 420 is relatively large to provide a realistic environment of an electricity feeder station, and can be supported by a large panel and personal computer connected to the panel. Hence, the behavior of the test piece 100 and impacts thereof on a real electric power system are displayed on the personal computer associated with the first display 410 and on the large panel associated with the second display 410. Through the second display 420, electric power system operators can receive training on electric power system control and operation strategies to cope with various contingencies generated by the simulator 200. The first display 410 and second display 420 each can have a software configuration as illustrated in FIG. 5. That is, each of the first display 410 and second display 420 employs Windows XP Families as an operating system, Java and JDK 1.4 as languages, and Eclipse and Rich Client Platform as tools.

The MMI client 400 can have a configuration as illustrated in FIG. 6. That is, the MMI client 400 includes an interface manager for interface management, a power information manager for management of electric power information, a common component manager for managing common components, a task manager for task management, an event manager for managing events, a render manager for management of rendering, and a component manager for managing components. To be more specific, the interface manager includes an MMI server interface; the power information manager includes a case information aquisitor, tag information aquisitor, tag value aquisitor, and data pool; the common component manager includes Utility, Property, Logstat, and Error; the task manager includes a power information controller and time invoker; the event manager includes a synchronization procedure and Canvas operator; the render manager includes a singleline renderer, GIS renderer, and etc renderer; and the component manager includes a component generator and component controller.

Next, in the monitoring system 500, communication between the simulator 200, MMI platform 300 and MMI client 400 is described in detail.

The MMI platform 300 uses a SimProtocol get command (CMD_READLIST) to obtain electric power system simulation data (for example, electric power system voltages, currents, bus voltages, line power flows, and breaker status) from the simulator 200 connected to a test piece 100, and uses a SimProtocol set command (CMD_MODIFY) to cause a state change in a simulated electric power system case according to a user request. Overall communication between the MMI platform 300 and simulator 200 is accomplished by UDP communication using Ethernet ports. To be more specific, for the MMI platform 300 to obtain data from the simulator 200, the MMI platform 300 sends a CMD_READLIST command through UDP to the simulator 200, and, in return, the simulator 200 sends corresponding memory values through UDP to the MMI platform 300. Similarly, for the MMI platform 300 to modify a control variable (for example, accident indicator, breaker status, and generator output) of a simulated electric power system case in the simulator 200, the MMI platform 300 sends a CMD_MODIFY command through UDP to the simulator 200, and the simulator 200 modifies a corresponding control variable and sends a response through UDP to the MMI platform 300. Here, an electric power system facility (for example, a generator) in the simulated electric power system is possible to adjust an instruction of the output and terminal voltages through a control signal of the test piece 100 connected to the simulator 200 to thereby realize system control effects.

Thereafter, electric power system simulation data generated by the simulator 200 is rapidly and accurately collected by the MMI platform 300 and stored in the data collector 310 so that electric power system operators can review the collected data afterwards. Collected electric power system simulation data is maintained as a database for easy search and use. The MMI server 320 visualizes real-time simulated electric power system data and electric power system status data stored in the data collector 310 using visualization programs of the algorithm server 330 for display on a monitoring screen using a one-line diagram (FIG. 7), on a GIS-based 3D monitoring screen (FIG. 8), on a run-time monitoring screen of the personal computer associated with the first display 410, and on a large panel associated with the second display 420. Hence, the electric power system operator can intuitively identify the status of an electric power system in which the test piece 100 is installed.

One-line diagrams are generally used for electric power system analysis, and the monitoring screen using a one-line diagram provides a familiar screen to the user. An electric power system to be simulated is modeled in a one-line diagram in advance, the model is compared during simulation with real-time electric power system data from the simulator 200 or electric power system status data (INF file) stored in the data collector 310 of the MMI platform 300, and the electric power system simulation data in relation to the test piece 100 is displayed on the one-line diagram.

The GIS-based 3D monitoring screen can be used to display actual locations of buses, lines, and generators constituting an electric power system in a manner matching the electric power system simulation data in relation to the test piece 100, providing more versatile information to the electric power system operator.

The run-time monitoring screen is used to provide the electric power system operator with electric power system data varying with time.

As described above, the monitoring system using a real-time simulator including a simulator, MMI platform and MMI client provides a simulation environment of a real electric power system that enables testing of a new electric power system control facility. Hence, the operation of the new electric power system control facility and effects thereof on a real electric power system can be evaluated before actual installation. That is, problems that may occur when the new electric power system control facility is installed in an existing electric power system can be identified and solved in advance. As a result, the reliability of the new electric power system control facility with respect to the existing electric power system can be enhanced.

Although the embodiments of the present invention have been described in detail hereinabove, it should be understood that many variations and modifications of the basic inventive concept herein described will still fall within the spirit and scope of the present invention as defined in the appended claims.

What is claimed is:

1. A monitoring system using real-time simulator, comprising:
 a test piece to be installed in an electric power system;

a simulator connected to the test piece, and deriving electric power system simulation data related to the test piece by simulating the electric power system with respect to the test piece;

a multimedia interface (MMI) platform interworking with the simulator, providing the simulator with electric power system status data for simulating the electric power system with respect to the test piece, and receiving the electric power system simulation data related to the test piece from the simulator; and an MMI client interworking with the MMI platform to display the electric power system simulation data related to the test piece from the MMI platform, wherein the MMI platform comprises:

a data collector storing the electric power system status data to be provided to the simulator, and the electric power system simulation data related to the test piece coming from the simulator;

an MMI server interworking with the simulator and data collector, and controlling transmission of the electric power system status data to the simulator and reception of the electric power system simulation data from the simulator, and an algorithm server interworking with the MMI server, computing the active and reactive power flowing in each line and the voltage and phase angle at each bus on the basis of the electric power system simulation data related to the test piece from the simulator, and visualizing the computed values, wherein the algorithm server includes an interface manager for interface management, a MMI server related manager for managing interworking with the MMI server, a common component manager for managing common components, an RTDS related manager for managing interworking with the simulator, an RTDS information manager for managing information from the simulator, and a data manager for data management.

2. The monitoring system of claim 1, wherein the electric power system simulation data related to the test piece comprises information regarding voltages, currents, bus voltages, line power flows and breaker statuses of the simulated electric power system.

3. The monitoring system of claim 1, wherein the electric power system status data comprises information regarding voltage changes, frequency changes, component changes, and contingencies in the electric power system.

4. The monitoring system of claim 1, wherein the simulator communicates with the MMI platform through an Ethernet connection.

5. The monitoring system of claim 1, wherein the MMI client communicates with the MMI platform through Transmission Control Protocol/Internet Protocol (TCP/IP).

6. The monitoring system of claim 5, wherein the MMI client comprises:

a first display having a plurality of personal computers, and displaying the electric power system simulation data related to the test piece on the personal computers in connection with the MMI server of the MMI platform; and a second display having a large panel, and displaying the electric power system simulation data related to the test piece on the large panel in connection with the MMI server of the MMI platform.

7. The monitoring system of claim 6, wherein the electric power system simulation data related to the test piece is displayed on one of a screen using a one-line diagram, a GIS-based 3D screen, and a run-time screen.

* * * * *